United States Patent [19]

Kondo et al.

[11] Patent Number: 5,373,114
[45] Date of Patent: Dec. 13, 1994

[54] CIRCUIT SUBSTRATE

[75] Inventors: Hideo Kondo, Atsugi; Chiaki Funabiki; Kazunori Hirosawa, both of Yokohama, all of Japan

[73] Assignee: Stanley Electric Co., Ltd., Tokyo, Japan

[21] Appl. No.: 55,371

[22] Filed: May 3, 1993

[30] Foreign Application Priority Data

May 8, 1992 [JP] Japan .................. 4-143344

[51] Int. Cl.⁵ .............................. H05K 1/02
[52] U.S. Cl. .................. 174/268; 174/254; 361/774; 361/777
[58] Field of Search .......... 174/261, 268, 254; 361/749, 774, 777; 439/77

[56] References Cited

U.S. PATENT DOCUMENTS

| | | |
|---|---|---|
| 2,963,535 | 12/1960 | Wegener et al. ......... 174/268 X |
| 3,221,095 | 11/1965 | Cook . |
| 3,499,098 | 3/1970 | McGahey et al. ......... 174/261 |
| 3,727,169 | 4/1973 | Henschen et al. . |
| 4,580,193 | 4/1986 | Edwards ................ 361/407 |

Primary Examiner—Leo P. Picard
Assistant Examiner—L. Thomas
Attorney, Agent, or Firm—Varndell Legal Group

[57] ABSTRACT

A circuit substrate comprises, on a surface of a substrate, an electronic-part packaging section extending longitudinally and a plurality of conductive patterns extending in parallel relation to each other along the electronic-part packaging section. The conductive patterns and electronic parts are electrically connected to each other by wire bonding. The conductive patterns are drawn around in a stairway manner at an area or region of the wire bonding, to form a plurality of stairway-like steps. The stairway-like steps are so formed as to extend in consideration of overhang of bonding wires. The stairway-like steps are so arranged as to extend slightly obliquely with respect to the electronic-part packaging section such that the stairway-like steps are located substantially at the same distance with respect to the electronic-part packaging section.

8 Claims, 4 Drawing Sheets

CIRCUIT SUBSTRATE

BACKGROUND OF THE INVENTION

The present invention relates to a circuit substrate having high density patterns.

Conventionally, a circuit: substrate of the kind referred to above is arranged as shown in FIG. 5 of the attached drawings, for example. In FIG. 5, a circuit substrate 1 comprises a predetermined configuration at a surface of a printed board 2, that is, an electronic-part mounting or packaging section 4 arranged in one direction (in a lateral direction in an illustrated case) and a circuit 3 having a plurality of conductive patterns 3a which extend in parallel relation to each other along the electronic-part packaging section 4. Bonding wires 5 are used at respective connections of the circuit 3, that is, with respect to respective bonding pads 3b, whereby connecting terminals (not shown) of an electronic part 6 are electrically connected to the circuit 3.

By the way, in the circuit board 1 arranged as described above, wire bonding with respect to the conductive patterns 3a is performed in such a manner that the bonding pads 3b must be lengthened in a direction the same as that of the bonding wires 5, in order to crimp or pressure-bond the bonding wires 5 and to form stable loops. For this reason, there is nothing to arrange the circuits 3 by a necessary minimum length L' for pressure-bonding the bonding wires 5 of the respective bonding pads 3b and a pitch of gaps $L_1'$ between the adjacent conductive patterns 3a. Thus, it is difficult to increase the density of the circuit 3.

Further, as shown In FIG. 6, if a distance between the conductive pattern 3a to be connected by the wire bonding and the electronic part 6 is relatively long, a loop of the bonding wire 5 is not stabilized, and overhangs occur. Accordingly, there is a case where the bonding wire 5 is in contact with other conductive patterns 3a which are stridden by the bonding wire 5. As a result, there is a case where failure occurs due to wiring short-circuit.

Moreover, if the bonding pad 3b is lengthened by dimension corresponding to the overhang of the bonding wire 5 such that the bonding wire 5 and other conductive patterns 3a over which the bonding wire 5 strides are not short-circuited to each other, there occurs a disadvantage that the density of the circuit 3 is further reduced.

SUMMARY OF THE INVENTION

It is an object of the invention to provide a circuit substrate in which there can be provided substantially high pattern density, wire bonding is surely or reliably performed, and there is no case where wiring short-circuit occurs.

According to the invention, there is provided a circuit substrate comprising:

a substrate;

a circuit including an electronic-part packaging section extending longitudinally on a surface of the substrate and a plurality of conductive patterns extending in parallel relation to each other along the electronic packaging section; and wire bonding through which the conductive patterns and the electronic-part packaging section of the circuit are electrically connected to each other;

wherein the conductive patterns are drawn around in a stairway manner at an area at which bonding wires are to be connected respectively to the conductive patterns, to form stairway-like steps, and wherein each of the stairway-like steps is formed longer than width of a corresponding one of the conductive patterns as a bonding pad.

Preferably, the stairway-like steps of the conductive patterns extend slightly obliquely with respect to the electronic-part packaging section such that the stairway-like steps of the conductive patterns are located substantially at the same distance with respect to the electronic-part packaging section.

With the above arrangement of the invention, since, in the conductive patterns, wire bonding is performed at the stairway-like steps, the necessary minimum dimension or size for pressure-bonding the bonding wires respectively to the steps is secured, and width of each of portions of the conductive patterns other than the steps can be narrowed or reduced without consideration of the wire bonding. Accordingly, it is possible to bring the steps close to the electronic-part packaging section. Thus, since the width of the entire conductive patterns can be arranged relatively narrow or can be arranged so as to be reduced, there can be produced high pattern density.

Furthermore, in a case where the bonding wires are long, even if the steps are further lengthened or extended in the direction of the bonding wires in consideration of the overhang, the width of the entire conductive patterns spreads only the dimension of an extension of the step of one conductive pattern regardless of the number of conductive patterns, because the step is in the form of the stairway. That is, there can be provided steps which consider overhangs of the respective bonding wires without substantial reduction of the pattern density. Since there can be produced the steps by the dimensions in which the bonding wires can stably be connected, the wire bonding can surely or reliably be performed, and is not in contact with other bonding wires and other conductive patterns. Thus, failure due to wiring short-circuit does not also occur.

Further, in a case where a plurality of above-described arrangements are repeated in the longitudinal direction of the substrate, the stairway-like steps of the conductive patterns are so formed as to obliquely extend slightly with respect to the electronic-part packaging section such that the stairway-like steps are located at distances substantially the same as each other with respect to the electronic-part packaging section. Accordingly, if the plurality of above-described arrangements are repeated, it is possible to arrange the circuit high in density, without a change in the entire width of the conductive patterns.

As described above, according to the invention, each of the conductive patterns is formed in the form of stairway, and it is possible to perform wire bonding at each of the steps. Thus, it is possible to narrow or reduce the width of portions except for the steps without consideration of the wire bonding. Accordingly, since the entire width of the conductive patterns can be arranged relatively narrow, there can be produced high pattern density. Furthermore, since it is possible to connect the bonding wires respectively to the steps which are elongated in consideration of overhang of the bonding wires, connection is made sure. The bonding wires are not in contact with other bonding wires and other conductive patterns, and failure due to wiring short-circuit does not also occur.

Moreover, in a case where a plurality of electronic parts are packaged, the stairway-like steps of the conductive patterns are so arranged as to extend slightly obliquely with respect to the electronic-part packaging section. Thus, it is possible to repeat the plurality of electronic parts without spreading or extension of the entire width of the conductive patterns.

Thus, according to the invention, there is provided an extremely superior circuit substrate in which there can be produced substantially high pattern density, wire bonding is surely performed, and wiring short-circuit does not occur or is not generated.

DESCRIPTION OF THE EMBODIMENTS

The invention will hereunder be described in detail with reference to embodiments illustrated in the accompanying drawings.

Figure 1:
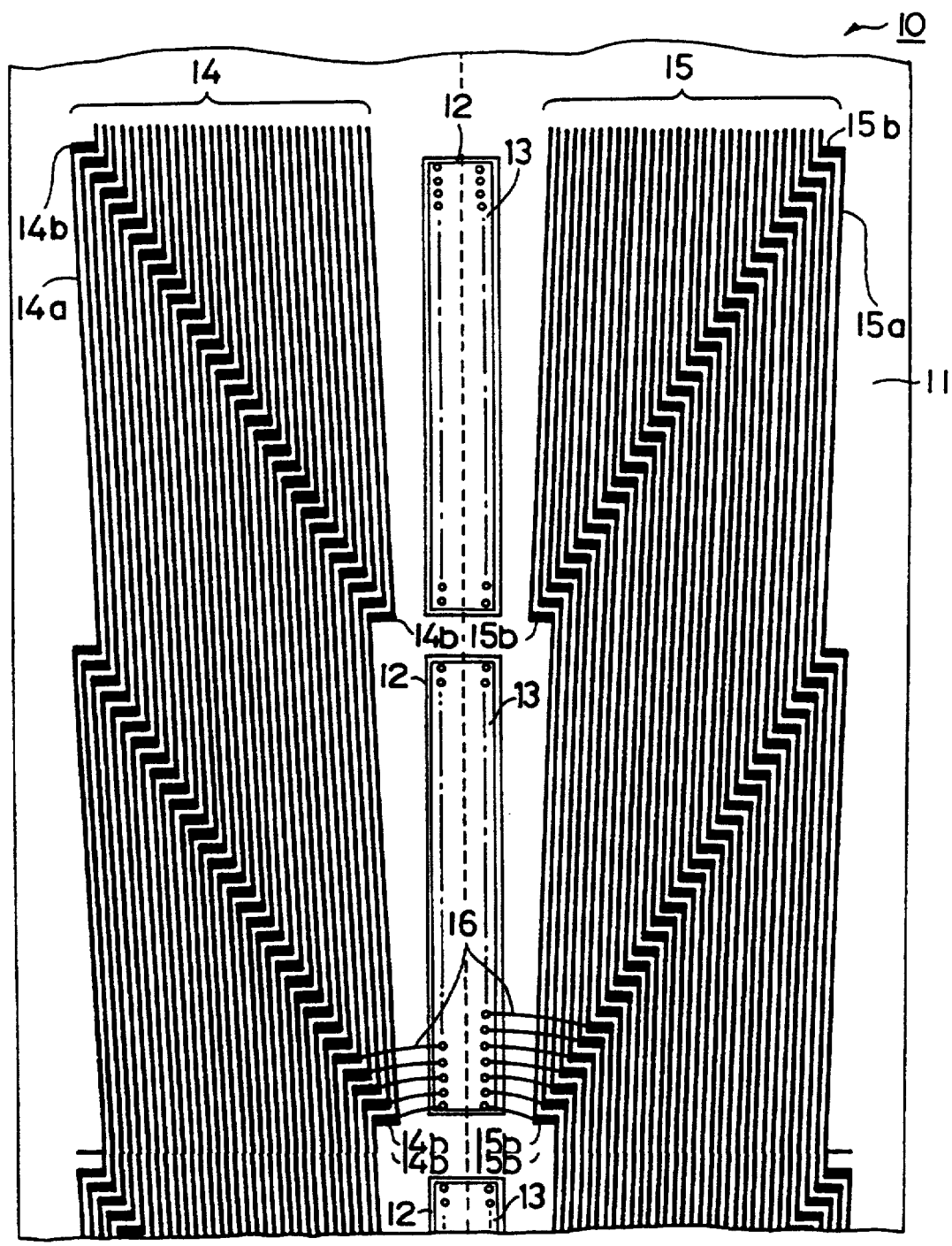
FIG. 1 is a top plan view showing an embodiment of a circuit substrate according to the invention.

FIG. 1 shows a circuit substrate 10 according to the invention. The circuit substrate 10 forms or arranges a dynamic drive circuit, for example. On the surface of a printed substrate 11, the circuit substrate 10 comprises a first circuit 14 and a second circuit 15 which include at Least one (three in an illustrated case) electronic-part packaging section 12 so arranged as to extend longitudinally at a center of the printed substrate 11, in a case illustrated, so arranged as to extend lengthwise, electronic parts 13 packaged respectively onto the electronic-part packaging sections 12, and a plurality of (thirty-two (32) in the illustrated case) conductive patterns 14a and 15a which are arranged respectively on both sides of the electronic-part packaging sections 12 and which extend longitudinally along the electronic-part packaging sections 12 and in parallel relation to each other.

In connection with the above, in a case of the present embodiment, the electronic parts 13 are LED arrays, for example, while the conductive patterns 14a and 15a form feeding lines which perform feeding with respect to the LEDs of the LED arrays.

Figure 2:
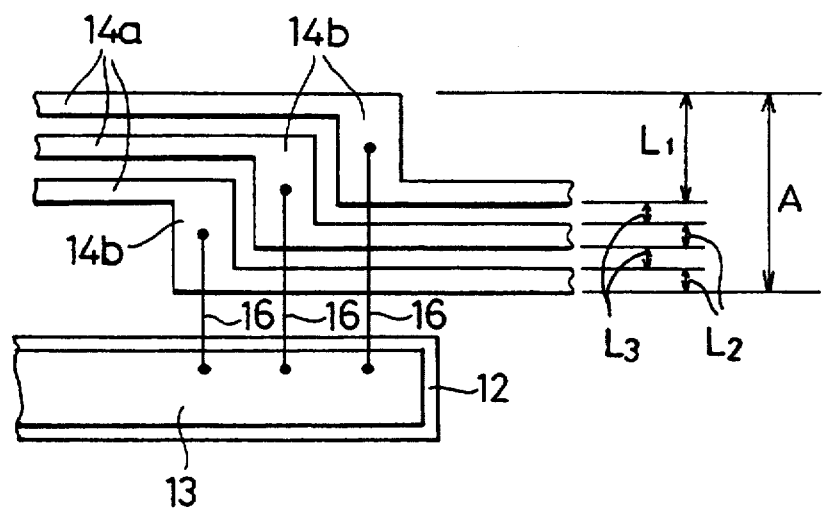
FIG. 2 is a fragmentary top plan view showing, in enlargement, a portion of the circuit substrate illustrated in FIG. 1.
Figure 3:
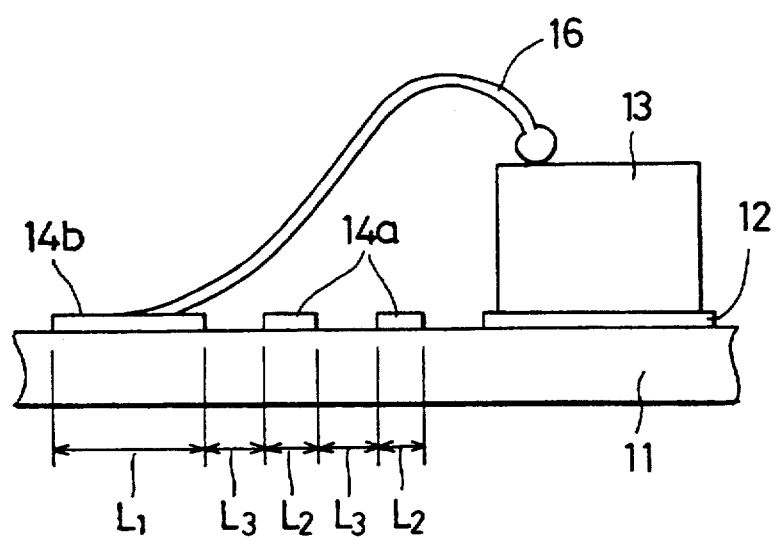
FIG. 3 is a fragmentary schematic side elevational view of the circuit substrate illustrated in FIG. 2.

The conductive patterns 14a and 15a of the respective first and second circuits 14 and 15 are drawn around or pulled around in a stairway manner at an area to be connected when the first and second circuits 14 and 15 are connected respectively to connecting terminals (not shown) of the respective LEDs 13 by bonding wires, as shown in detail in FIGS. 2 and 3. Here, each of stairway-like steps 14b and 15b of the respective conductive patterns 14a and 15a is formed wide in width as a bonding pad, and another portion except For each of the steps 14b and 15b is formed narrow as fiat as possible. By doing so, the entire width of each of the circuits 14 and 15 due to the conductive patterns 14a and 15a can be arranged relatively narrow.

Referring to FIG. 2, width $\underline{A}$ of the three conductive patterns can be expressed by the following equation:

$$A = L_1 + 2L_2 + 2L_3$$

Figure 4:
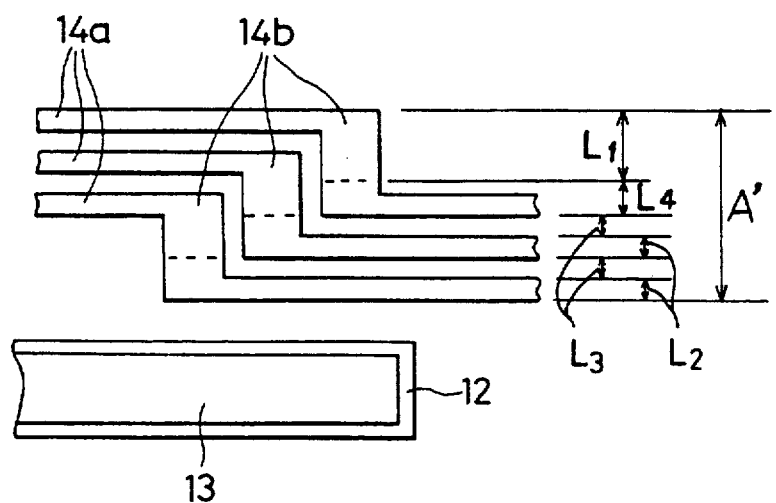
FIG. 4 is a fragmentary top plan view showing another embodiment of the circuit substrate according to the invention.
Figure 5:
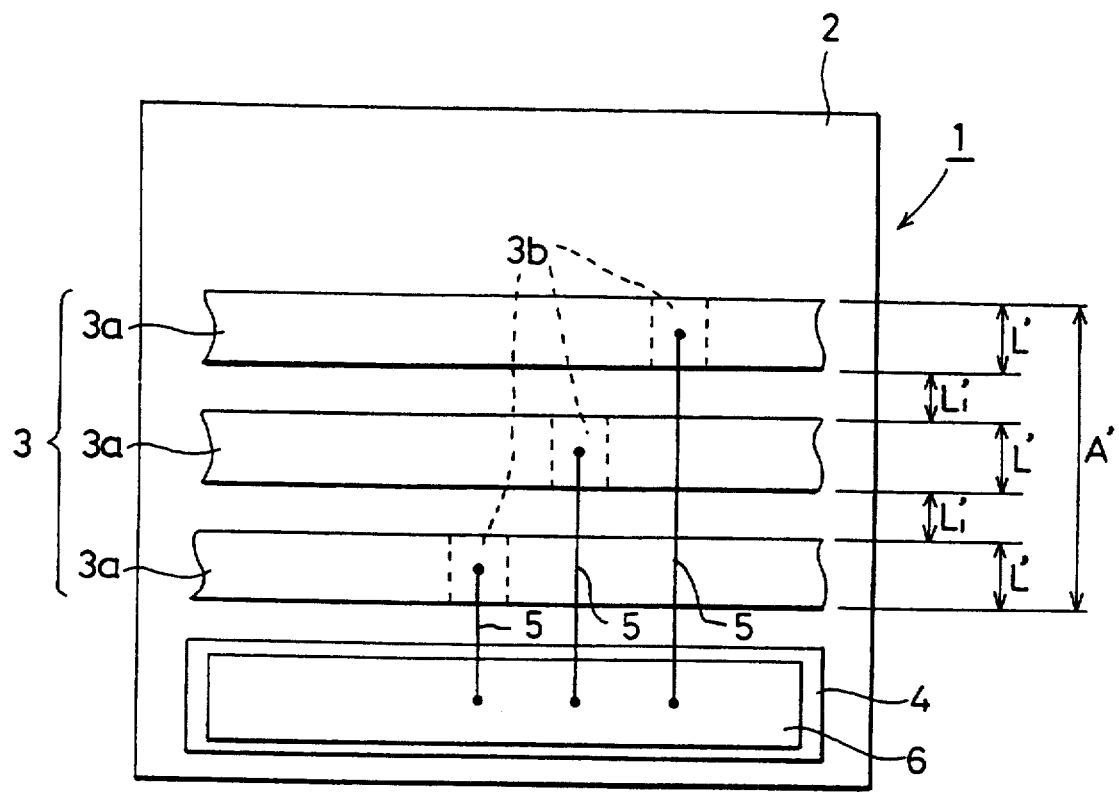
FIG. 5 is a fragmentary schematic top plan view showing an example of a conventional circuit substrate.
Figure 6:
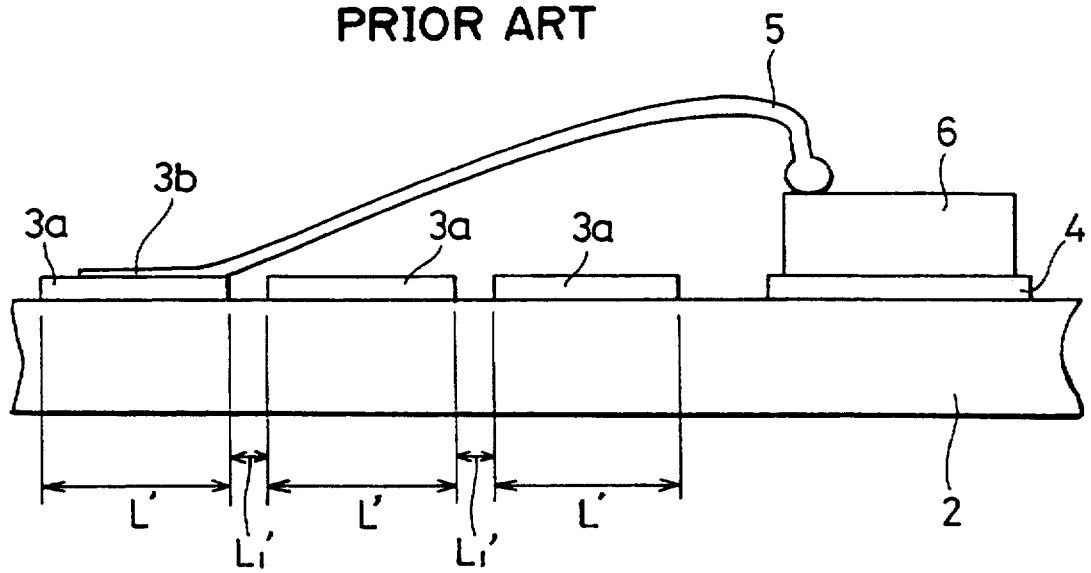
FIG. 6 is a fragmentary schematic side elevational view of the circuit substrate illustrated in FIG. 5.

Moreover, as shown in FIG. 4, even if the step is elongated by $L_4$ in consideration of overhang of the bonding wire, width A' of the three conductive patterns shown can be expressed by the following equation:

$$A' = L_1 + 2L_2 + 2L_3 + L_4$$

Thus, the width A' can spread only by $L_4$. Similarly, the entire width of each of the circuits 14 and 15 spreads only by $L_4$, not depending upon the number of conductive patterns.

In connection with the above, as shown in FIG. 1, the conductive patterns 14a and 15a extend slightly obliquely with reference to the longitudinal direction of the electronic-part packaging sections 12 such that edges of the respective stairway-like steps 14b and 15b are located substantially at the same distance with respect to the electronic-part packaging sections 12.

The circuit substrate 10 according to the invention is arranged as described above. In a case where wiring due to wire bonding is performed, bonding wires 16 are connected respectively to the steps 14b and 15b which are formed stepwise or in a stairway manner on the conductive patterns 14a and 15a, whereby the wire bonding is performed (refer to FIGS. 2 and 3). At the time of the wire bonding, portions except for the steps 14b and 15b can be narrowed in width. Accordingly, the entire width of the circuits 14 and 15 due to the conductive patterns 14a and 15a can be formed relatively narrow. Thus, there can be produced high pattern density.

Furthermore, the bonding wires 16 are connected to the steps 14b and 15b which are elongated in consideration of overhang of the bonding wires 16 with respect to the conductive patterns 14a and 15a. Thus, it is possible to surely perform the connection without reduction of the pattern density, and there is no case where the bonding wires 16 are in contact with other bonding wires 16 and other conductive patterns 14a and 15a. Accordingly, failure due to wiring short-circuit does not occur.

Moreover, the conductive patterns 14a and 15a extend slightly obliquely with respect to the electronic-part packaging section 12 such that the stairway-like steps 14b and 15b are located substantially the same distance with respect to the electronic-part packaging sections 12, whereby the plurality of arrangements each including portions of the respective conductive patterns 14a and 15a, the electronic-part packaging sections 12 and the electronic parts 13 can be repeated without the entire width of the circuits 14 and 15 spreading or extending due to the conductive patterns 14a and 15a. Thus, miniaturization is promoted.

What is claimed is:

1. A circuit substrate comprising:
   a substrate;
   a circuit arranged on said substrate, said circuit including an electronic-part packaging section extending in a longitudinally direction of said substrate and a plurality of conductive patterns adjacent to said electronic packaging section, each conductive pattern of said plurality of conductive patterns having first and second elongated sections joined together by a middle section; said first, second and middle sections of said each conductive pattern respectively arranged parallel to first, second and middle sections of an adjacent conductive pattern; said first sections of said plurality of conductive patterns having identical lengths, bonding wires electrically connecting said middle sections to said electronic-part packaging section, wherein each of said middle sections is arranged at a different distance from an end of said substrate along said longitudinal direction thereof for electrically connecting said middle sections to said electronic-part packaging section without overlap of said bonding wires.

2. A circuit substrate according to claim 1, including electronic parts packaged on said electronic-part packaging section, wherein said electronic parts form an LED array.

3. A circuit substrate according to claim 2, wherein said conductive patterns form feeding lines which perform feeding with respect to a plurality of LEDs of the LED array.

4. A circuit substrate according to claim 1, wherein said first sections of said plurality of conductive patterns are arranged at an oblique angle relative to said longitudinal direction of said substrate.

5. A circuit substrate according to claim 1, wherein said first and second sections of said plurality of conductive patterns are arranged at an oblique angle relative to said longitudinal direction of said substrate.

6. A circuit substrate according to claim 1, wherein said middle sections of said plurality of conductive patterns are arranged in a straight line at an oblique angle relative to said longitudinal direction of said substrate.

7. A circuit substrate according to claim 1, wherein said first and second sections respectively join said middle section at a right angle.

8. A circuit substrate according to claim 1, wherein three of said conductive patterns arranged adjacent to each other have a width A defined by the following expression:

$$A = L_1 + 2L_2 + 2L_3$$

where $L_1$ is a width of said middle section, $L_2$ is a width of said first section and $L_3$ is a distance between adjacent said first sections.

* * * * *